(12) United States Patent
Wang et al.

(10) Patent No.: US 12,189,307 B2
(45) Date of Patent: Jan. 7, 2025

(54) METROLOGY DATA CORRECTION USING IMAGE QUALITY METRIC

(71) Applicant: ASML NETHERLANDS B.V., Veldhoven (NL)

(72) Inventors: Fuming Wang, Santa Clara, CA (US); Stefan Hunsche, Santa Clara, CA (US); Wei Fang, Milpitas, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 606 days.

(21) Appl. No.: 17/268,863

(22) PCT Filed: Aug. 14, 2019

(86) PCT No.: PCT/EP2019/071774
§ 371 (c)(1),
(2) Date: Feb. 16, 2021

(87) PCT Pub. No.: WO2020/035516
PCT Pub. Date: Feb. 20, 2020

(65) Prior Publication Data
US 2021/0241449 A1 Aug. 5, 2021

Related U.S. Application Data

(60) Provisional application No. 62/719,378, filed on Aug. 17, 2018.

(51) Int. Cl.
*G03F 7/00* (2006.01)
*G06F 18/214* (2023.01)
(Continued)

(52) U.S. Cl.
CPC ........ *G03F 7/7065* (2013.01); *G03F 7/70625* (2013.01); *G03F 7/70633* (2013.01);
(Continued)

(58) Field of Classification Search
CPC ............... G03F 7/7065; G03F 7/70625; G03F 7/70633; G03F 7/70616; G03F 7/70641;
(Continued)

(56) References Cited

U.S. PATENT DOCUMENTS 6,597,447 B1   7/2003 Stirton et al.
6,746,882 B1   6/2004 Stirton et al.
(Continued)

FOREIGN PATENT DOCUMENTS

TW   201245906   11/2012
TW   201633006    9/2016
(Continued)

OTHER PUBLICATIONS

International Search Report and Written Opinion issued in corresponding PCT Patent Application No. PCT/EP2019/071774, dated Dec. 5, 2019.
(Continued)

*Primary Examiner* — Jonathan M Hansen
(74) *Attorney, Agent, or Firm* — Pillsbury Winthrop Shaw Pittman LLP

(57) ABSTRACT

A method for correcting metrology data of a patterning process. The method includes obtaining (i) metrology data of a substrate subjected to the patterning process and (ii) a quality metric (e.g., a focus index) that quantifies a quality of the metrology data of the substrate; establishing a correlation between the quality metric and the metrology data; and determining a correction to the metrology data based on the correlation between the quality metric and the metrology data.

20 Claims, 16 Drawing Sheets

(51) Int. Cl.
  *G06T 7/00* (2017.01)
  *G06T 7/73* (2017.01)
  *H01J 37/28* (2006.01)

(52) U.S. Cl.
  CPC .......... *G06F 18/214* (2023.01); *G06T 7/0004* (2013.01); *G06T 7/73* (2017.01); *G06T 2207/10061* (2013.01); *G06T 2207/20081* (2013.01); *G06T 2207/30148* (2013.01); *G06T 2207/30168* (2013.01); *H01J 37/28* (2013.01)

(58) Field of Classification Search
  CPC ....... G06F 18/214; G06T 7/0004; G06T 7/73; G06T 2207/10061; G06T 2207/20081; G06T 2207/30148; G06T 2207/30168; H01J 37/28
  See application file for complete search history.

(56) References Cited

U.S. PATENT DOCUMENTS

| | | | |
|---|---|---|---|
| 6,961,116 | B2 | 11/2005 | Den Boef et al. |
| 7,689,966 | B2 | 3/2010 | Verma et al. |
| 10,372,043 | B2 | 8/2019 | Chen et al. |
| 2006/0066855 | A1 | 3/2006 | Den Boef et al. |
| 2007/0041003 | A1 | 2/2007 | Ausschnitt et al. |
| 2009/0182529 | A1* | 7/2009 | Zangooie ............ G03F 7/70625 702/179 |
| 2011/0027704 | A1 | 2/2011 | Cramer et al. |
| 2011/0043791 | A1 | 2/2011 | Smilde et al. |
| 2012/0059505 | A1 | 3/2012 | Mos et al. |
| 2012/0242970 | A1 | 9/2012 | Smilde et al. |
| 2012/0331427 | A1 | 12/2012 | Tyminski et al. |
| 2014/0064603 | A1* | 3/2014 | Zhang ................ G01B 11/2513 382/154 |
| 2014/0195194 | A1* | 7/2014 | Brill .................... G03F 7/70625 702/155 |
| 2016/0342080 | A1 | 11/2016 | Beyer et al. |
| 2018/0129139 | A1 | 5/2018 | Jiang et al. |
| 2018/0203368 | A1 | 7/2018 | Gupta et al. |
| 2018/0259858 | A1 | 9/2018 | Chen et al. |
| 2019/0026885 | A1 | 1/2019 | Gready et al. |
| 2019/0074227 | A1* | 3/2019 | Peled ................ H01L 21/67253 |
| 2019/0311921 | A1 | 10/2019 | Mos et al. |

FOREIGN PATENT DOCUMENTS

| | | |
|---|---|---|
| TW | 201826033 | 7/2018 |
| TW | 201830173 | 8/2018 |
| WO | 2009078708 | 6/2009 |
| WO | 2009106279 | 9/2009 |
| WO | 2018072980 | 4/2018 |

OTHER PUBLICATIONS

Taiwanese Office Action issued in corresponding Taiwanese Patent Application No. 108128703, dated Sep. 22, 2020.

Hassen, R., et al: "No-reference image sharpness assessment based on local phase coherence measurement", 2010 *IEEE International Conference on Acoustics, Speech and Signal Processing*, Dallas, TX, USA, pp. 2434-2437 (2010).

Abe, H. et al.: "CD-SEM tool stability and tool-to-tool matching management using image sharpness monitor", Proc. of SPIE, vol. 7272 (2009).

Rana, N et al.: "Deep machine learning based image classification in hard disk drive manufacturing", Proc. of SPIE, vol. 10524 (Mar. 13, 2018).

Office Action issued in corresponding Taiwanese Patent Application No. 110141876, dated Jan. 30, 2023.

Office Action issued in corresponding Israeli Patent Application No. 280730, dated Feb. 9, 2023.

Office Action issued in corresponding Korean Patent Application No. 10-2021-7004720, dated Dec. 20, 2022.

Office Action issued in corresponding Chinese Patent Application No. 201980053080.8, dated Nov. 17, 2023.

* cited by examiner

METROLOGY DATA CORRECTION USING IMAGE QUALITY METRIC

CROSS-REFERENCE TO RELATED APPLICATIONS

This application is the U.S. national phase entry of PCT Patent Application No. PCT/EP2019/071774 which was filed on Aug. 14, 2019, which claims the benefit of priority of U.S. Patent Application No. 62/719,378 which was filed on Aug. 17, 2018, and which is incorporated herein in its entirety by reference.

TECHNICAL FIELD

The description herein relates generally to a patterning process and metrology apparatus. More particularly, an apparatus or a method for determining correction to metrology data.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment, there is provided a method for correcting metrology data of a patterning process. The method includes obtaining (i) metrology data of a substrate subjected to the patterning process and (ii) a quality metric that quantifies a quality of the metrology data of the substrate; establishing, via a computing system, a correlation between the quality metric and the metrology data; and determining, via the computing system, a correction to the metrology data based on the correlation between the quality metric and the metrology data.

In an embodiment, the determining the correction comprises determining a corrected value of the metrology data based on a correction model, wherein the metrology data is obtained via a metrology tool.

In an embodiment, the corrected value is determined based on a slope of the correlation between the quality metric and the metrology data, and a difference between a maximum value of the quality metric across the substrate and a value of the quality metric at a point of interest on the substrate.

In an embodiment, the quality metric is a focus index of an image of the substrate captured via the metrology tool.

In an embodiment, the focus index is determined based on a local phase coherence map that reveals a phase relationship, in a vicinity of a feature location on the substrate, between neighboring wavelet coefficients in a scale-space.

In an embodiment, the focus index is determined based on a sample selected from the image that has a relatively higher gradient compared to other locations on the image.

In an embodiment, the sample is an area of the image that has relatively high gradient values compared to rest of the areas of the image.

In an embodiment, the quality metric is independent of variations in a dose used in the patterning process.

In an embodiment, the metrology data comprises an image of a printed substrate, or a parameter of the patterning process.

In an embodiment, the parameter of the patterning process is a critical dimension, an edge placement error, or an overlay.

In an embodiment, the method further includes generating a map of a parameter of the patterning process based on the correction applied to the metrology data.

In an embodiment, the map is a dose map, a focus map, a critical dimension (CD) map, an overlay map, or an edge placement error map.

In an embodiment, the metrology data is a scanning electron microscope image, or an e-beam image.

In an embodiment, the method further includes training a correction model based on the correlation between the quality metric and the metrology data, wherein the correction model is configured to determine real-time corrections to metrology data collected during the patterning process.

In an embodiment, the correction model is included in a metrology tool.

Furthermore, according to an embodiment, there is provided a method for performing a real-time correction of metrology data of a patterning process. The method includes obtaining (i) metrology data of a substrate subjected to the patterning process and (ii) a correction model implementing a correlation between a quality metric and the metrology data for a particular pattern; and determining, via a computing system, a correction to the metrology data of the particular pattern based on the correction model.

In an embodiment, the determining the correction comprises determining a corrected value of the metrology data acquired via a metrology tool based on the correction model, wherein the metrology data is obtained via a metrology tool.

In an embodiment, the corrected value is determined based on a slope of the correlation between the quality metric and the metrology data, and a difference between a maximum value of the quality metric across the substrate and the quality metric.

In an embodiment, the quality metric is a focus index of an image of the substrate captured via the metrology tool.

In an embodiment, the metrology data includes an image of a printed substrate, or a parameter of the patterning process. In an embodiment, the metrology data includes the image of the printed substrate or the parameter of the patterning process includes the metrology data comprising the image of the printed substrate and the parameter of the patterning process In an embodiment, the method further includes grouping one or more of the particular patterns based on feature characteristics of the particular pattern into a pattern category; and determining the correction to the metrology data of the pattern belonging to the pattern category.

Furthermore, there is provided a computer program product comprising a non-transitory computer readable medium having instructions recorded thereon, the instructions when executed by a computer implementing the methods discussed above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
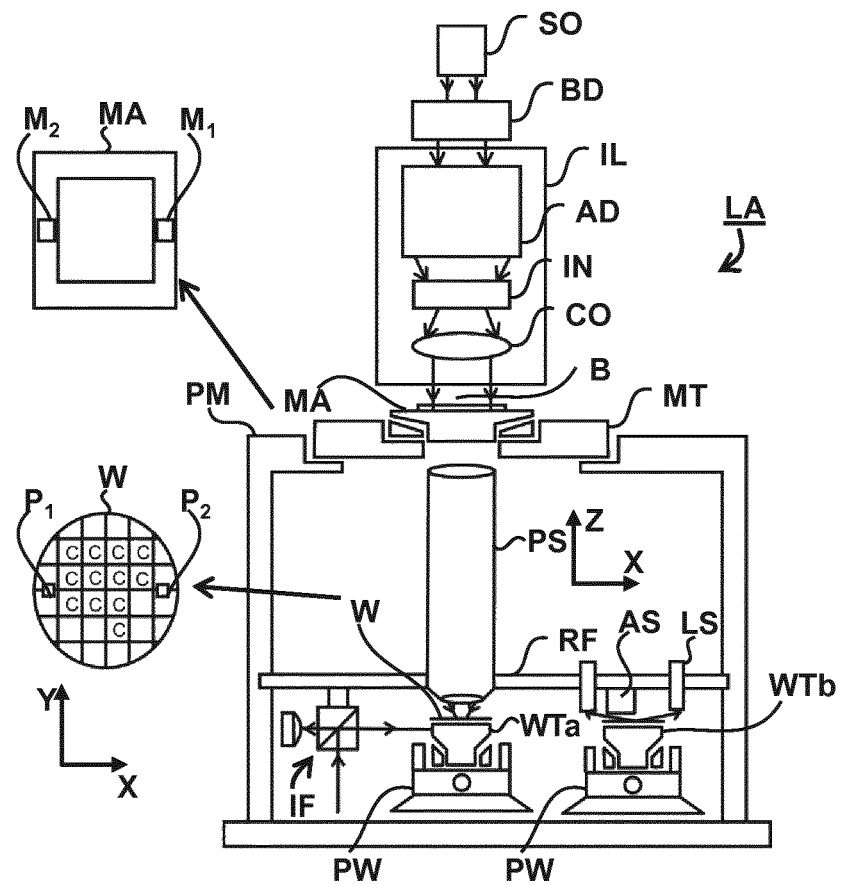
FIG. 1 schematically depicts a lithography apparatus according to an embodiment.

FIG. 1 schematically depicts an embodiment of a lithographic apparatus LA. The apparatus comprises:
   an illumination system (illuminator) IL configured to condition a radiation beam B (e.g. ultraviolet (UV) radiation or deep ultraviolet (DUV) radiation);
   a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator II, with the aid of a beam delivery system BD comprising for example suitable directing mirrors or a beam expander. In other cases the source may be an integral part of the apparatus, for example when the source is a mercury lamp. The source SO and the illuminator IL, together with the beam delivery system BD if required, may be referred to as a radiation system.

The illuminator IL, may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator II, may be operable to limit the distribution of the beam in the pupil plane such that the intensity distribution is non-zero in a plurality of equally spaced sectors in the pupil plane. The intensity distribution of the radiation beam in a pupil plane of the illuminator II, may be referred to as an illumination mode.

So, the illuminator IL, may comprise adjuster AM configured to adjust the (angular/spatial) intensity distribution of the beam. Generally, at least the outer or inner radial extent (commonly referred to as σ-outer and σ-inner, respectively) of the intensity distribution in a pupil plane of the illuminator can be adjusted. The illuminator II, may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator II, or using a spatial light modulator.

The illuminator IL, may be operable alter the polarization of the beam and may be operable to adjust the polarization using adjuster AM. The polarization state of the radiation beam across a pupil plane of the illuminator II, may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; or deform one or more optical elements. Displacement of an optical element may be in any direction (x, y, z or a combination thereof). Tilting of an optical element is typically out of a plane perpendicular to the optical axis, by rotating about an axis in the x or y directions although a rotation about the z axis may be used for a non-rotationally symmetric aspherical optical element. Deformation of an optical element may include a low frequency shape (e.g. astigmatic) or a high frequency shape (e.g. free form aspheres). Deformation of an optical element may be performed for example by using one or more actuators to exert force on one or more sides of the optical element or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, or cleaning, etc.). In such "multiple stage" machines the additional tables may be used in parallel, or preparatory steps may be carried out on one or more tables while one or more other tables are being used for exposure. For example, alignment measurements using an alignment sensor AS or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B. e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion ((i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, critical dimension (CD), edge placement, overlapping, resist top loss, resist undercut or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
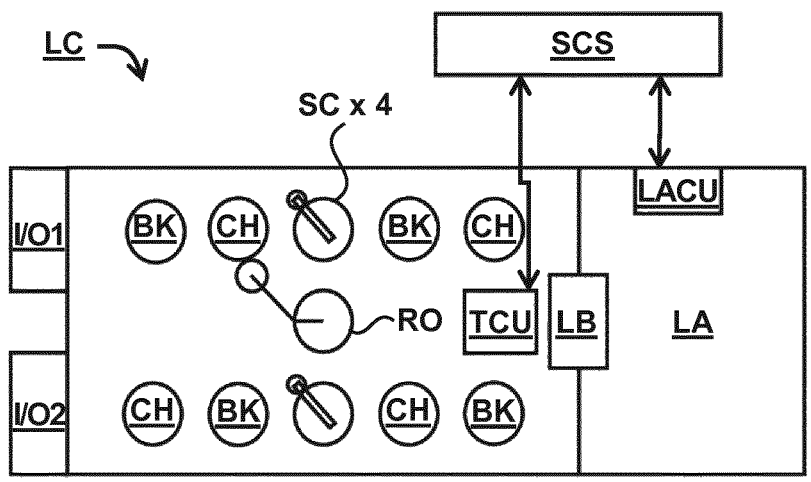
FIG. 2 schematically depicts an embodiment of a lithographic cell or cluster according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the $-1^{st}$ and $+1^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BIC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias May alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
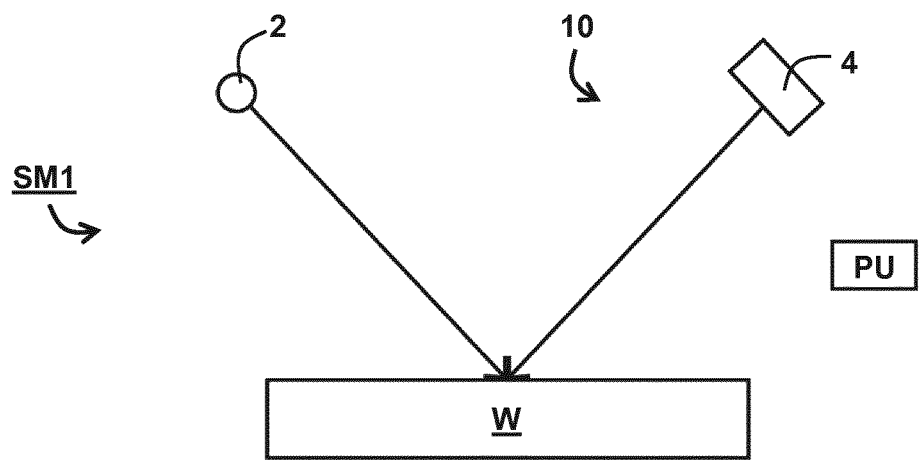
FIG. 3 schematically depicts an example inspection apparatus and metrology technique according to an embodiment.
Figure 3:
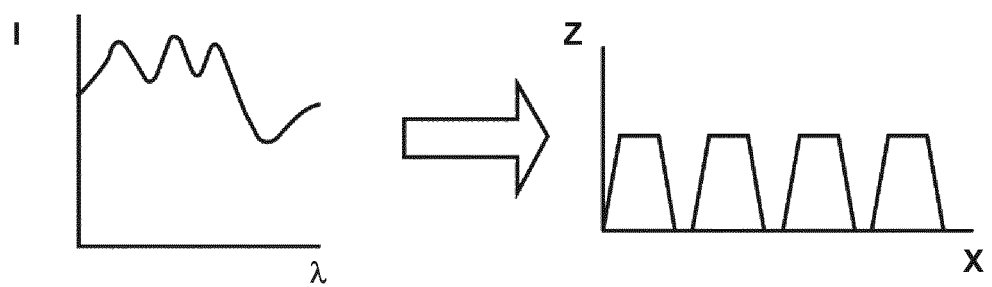

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
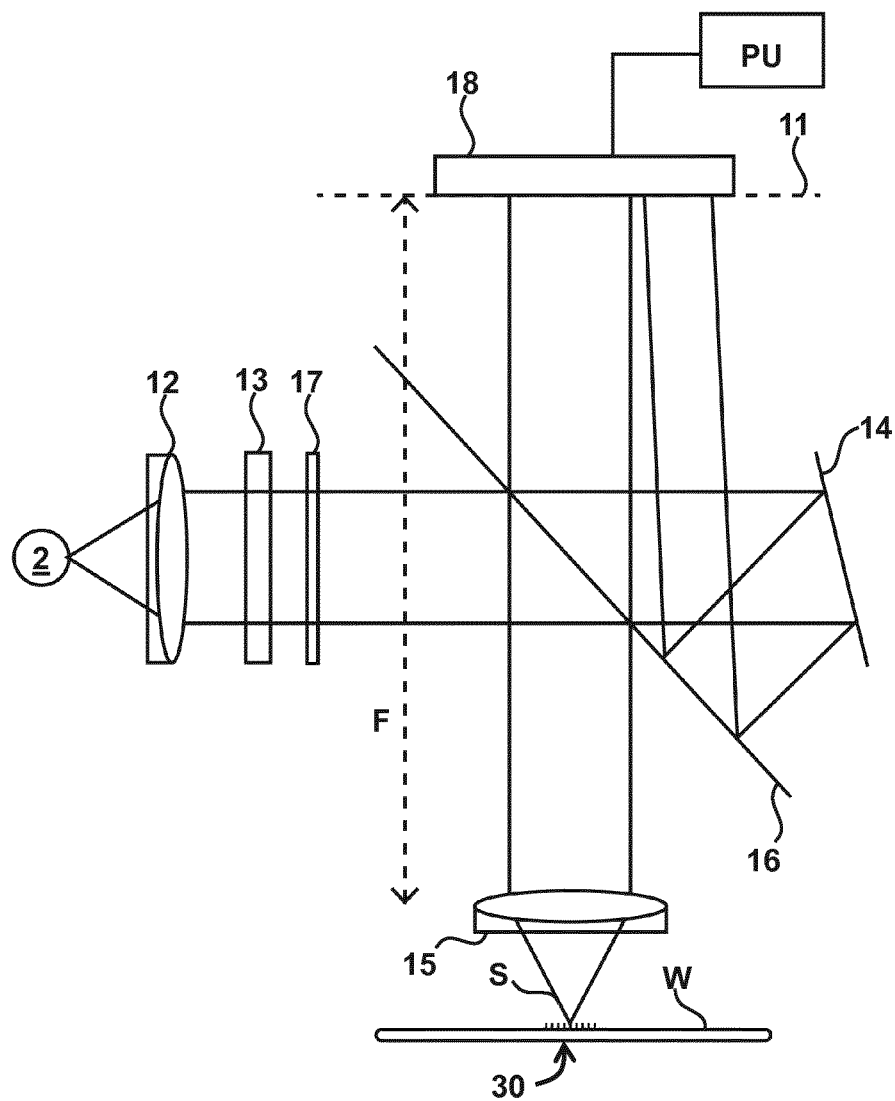
FIG. 4 schematically depicts an example inspection apparatus according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z, direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z or tilt direction) with the remainder of the optical system being stationary and the substrate is moving (e.g., in the X and Y directions, but also optionally in the Z or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or complementary metal-oxide-semiconductor (CMOS) sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width or shape, or one or more parameters of the 2-D grating, such as pillar or via width or length or shape, may be input to the reconstruction process, performed by processor PU, from knowledge of the printing step or other inspection processes.

In addition to measurement of a parameter by reconstruction, angle resolved scatterometry is useful in the measurement of asymmetry of features in product or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
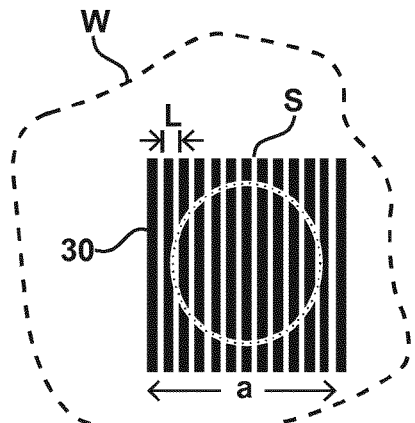
FIG. 5 illustrates the relationship between an illumination spot of an inspection apparatus and a metrology target according to an embodiment.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
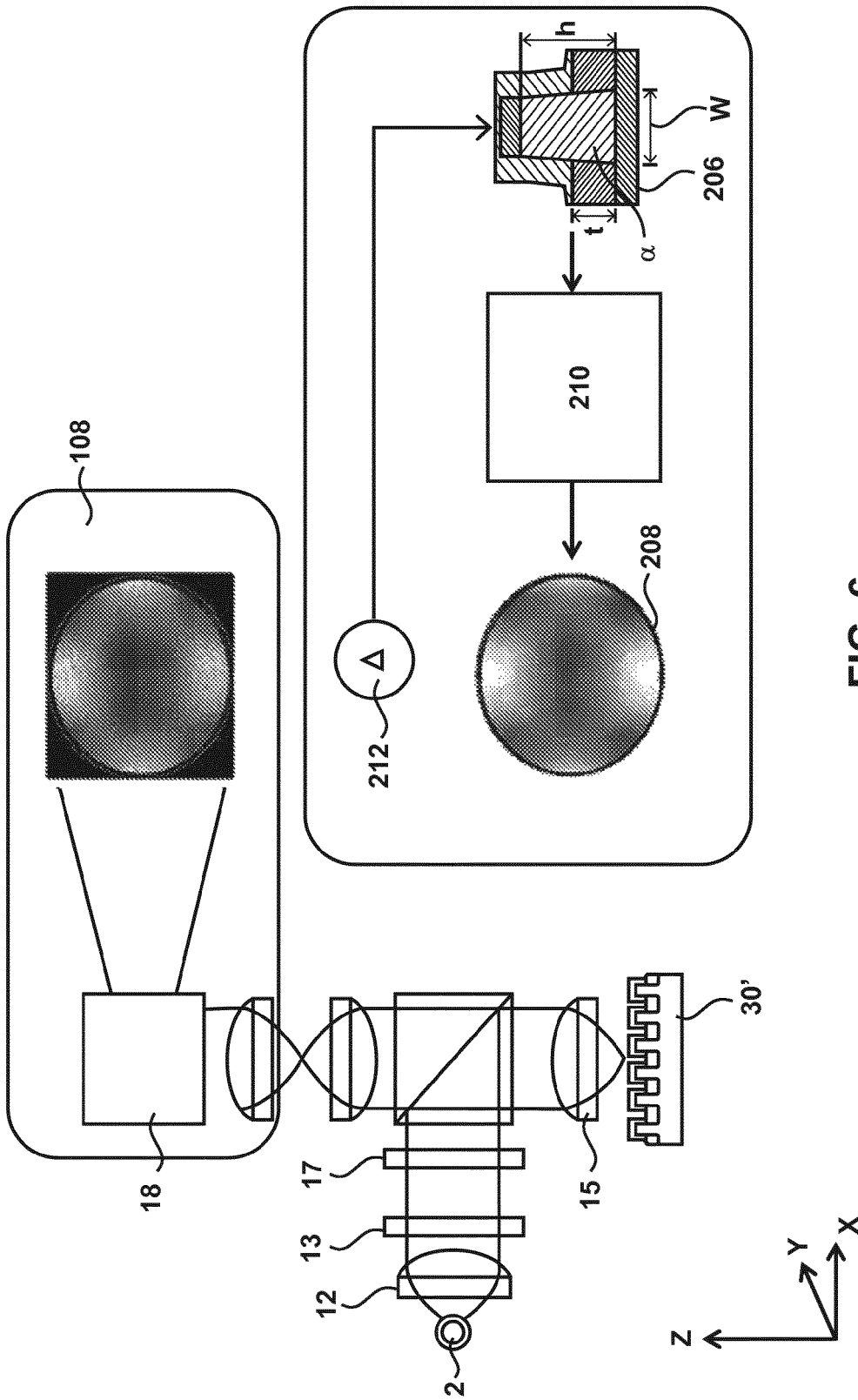
FIG. 6 schematically depicts a process of deriving a plurality of variables of interest based on measurement data according to an embodiment.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
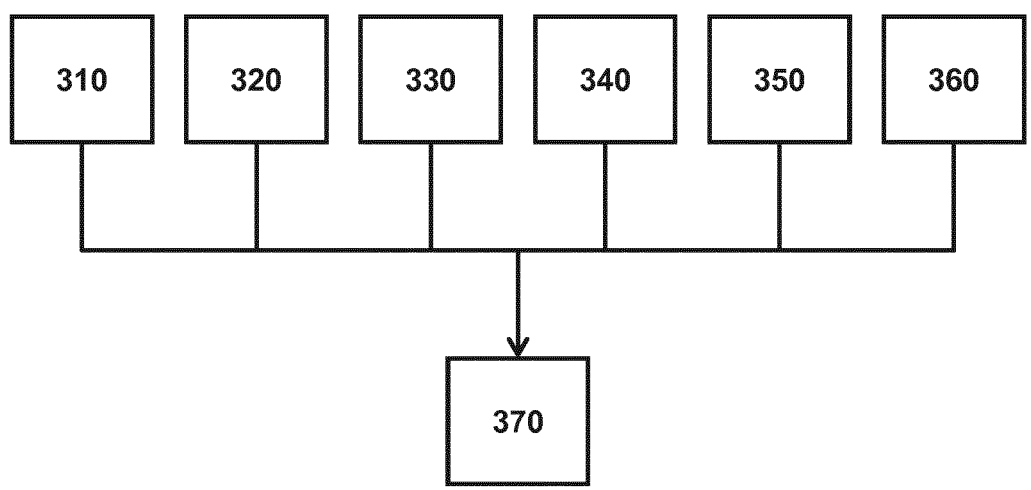
FIG. 7 shows example categories of processing variables according to an embodiment.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes or locations of assist features, adjustments applied by a resolution enhancement technique (RET), CD of mask features, etc. The fourth category may be variables 340 of the substrate. Examples include characteristics of structures under a resist layer, chemical composition or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Increasingly, metrology has become a burden especially in terms of time taken. This is, for example, particularly the case in the advent of multiple patterning techniques in the semiconductor industry. With multiple patterning techniques such as litho-etch-litho-etch (LELE) or sidewall assisted double patterning (SADP), the number of processing steps has increased significantly and therefore, so has the amount of metrology steps used for control and yield monitoring. Moreover, the amount of metrology increases for each node (e.g., due to reduction in feature size) as more layers are used in multiple patterning steps, and more patterning steps are used per layer.

Additionally or alternatively, there is an increased desire for defect determination or guided defect inspection. This involves substantially denser focus, overlay, or CD metrology than before.

Additionally or alternatively, there are ever tightening specifications on on-device CD, overlay, or focus performance. This drives manufacturing equipment specifications of, e.g., exposure tools and processing tools (e.g., deposition, etch, track, chemical mechanical polishing (CMP), etc.), from one node to the next. So, this drives tighter control and monitoring of performance which in turn drives the demand for ever increasing amounts of metrology for control and monitoring.

Additionally or alternatively, in line with tightening of the specifications on on-device CD, focus, or overlay performance, higher order corrections may be needed. A higher order correction is essentially a corrective action which is selective on a small spatial scale across all or part of the substrate (e.g. correction with a high spatial resolution). Higher order correction involves a denser sampling per substrate for metrology, thereby increasing the metrology burden perhaps beyond practical limits of metrology equipment productivity.

Additionally or alternatively, substrate to substrate variation may require further individual substrate level control (compared to, e.g., lot level control) and associated monitoring in order to achieve the desired CD, focus, or overlay performance. This may lead to measuring more substrates per lot and thus drive an increase in the amount of measurements used, perhaps beyond practical limits of metrology equipment productivity.

However, in order to meet the increased data demands, only adding metrology equipment or increasing metrology equipment productivity may not suffice. Moreover, it may not solve all problems such as obtaining dense CD, focus or overlay profiles across a substrate in a timely manner.

So, metrology efficiency is desirable. This is to obtain, e.g., higher density of data per substrate and data for a higher number of substrates per lot.

Therefore, in an embodiment, metrology data from multiple sources is combined and manipulated in order to derive accurate estimated values of one or more patterning process parameters (e.g., CD), focus, overlay, edge placement, etc.) for each of a plurality of locations across a substrate. The metrology data can include images obtained by a scanning electron microscope. In an embodiment, then, there is provided dense metrology data (e.g., for each square mm) for, e.g., all of the substrates processed in a patterning process and for, e.g., all of the layers processed on such substrates in the patterning process.

In an embodiment, metrology data and other data from various sources may be combined. For example, combining of measurements of a patterning process parameter of interest with data from one or more devices in the patterning process, such as data from one or more sensors of the lithographic apparatus. This combination of data may then be used to predict on-product performance in the form of, e.g., a patterning process parameter, such as CD, overlay, focus, pattern shift, edge placement (e.g., edge placement error), etc. or a parameter derived therefrom, such as yield, defects (e.g., risk of defect, defect counts, etc.), etc. Hence, it is important to have good quality metrology data, so that the on-product performance, corrections or adjustments to the patterning process, etc. can be determined accurately.

In an embodiment, the performance of the patterning process may be a measure or a metric based on, for example, a pattern fidelity matching (PFM) technique, which aims to predict & detect patterning defects on printed substrates. The PFM involves several steps including (1) identifying critical patterns in a mask layout, also known as hotspots, (2) characterizing sensitivities of these hotspots with respect to various process variations such as scanner focus, overlay, etch fingerprints etc., (3) estimating process variations for substrates being processed, and predicting locations on the substrate having highest probabilities of a hotspot becoming defects as a result of such process variations. Furthermore, (4) an inspection tool (e.g., e-beam apparatus) may be guided to such a predicted hotspot location to verify an actual occurrence of defects or accurate determination of defect sizes.

In an embodiment, with reference to the first step (1) the critical patterns in the mask layout may be identified by means of computational metrology, substrate inspection during the patterning process, or a combination thereof. However, steps 2-4 require the inspection tool (e.g., e-beam/SEM) based metrology of hotspots to distinguish defects from non-defects. In addition, for example, a CD metrology of generic test patterns may be used to characterize across-substrate process variations (e.g., represented as process maps) of, for example, an etch process induced or a track induced systematic patterning variations. As such, accurate and robust metrology is desired for accurate PFM system performance.

Metrology generally comprises an execution of a sequence of move-acquire-measure (MAM) actions, to move a stage to an intended measurement location, acquire data (e.g., SEM images), then generate measurement values by analysis of acquired data (e.g., the SEM images).

In an embodiment, a good image quality (or good metrology data in general) depends on the metrology tool being properly focused on a surface of the substrate. Focusing of the metrology tool may be accomplished by autofocusing, i.e. a through-focus scan while observing an 'image sharpness'. But, to avoid potential damage to the substrate, focus scans may not be performed at an actual metrology location. Also, the focus scan may not be performed for every location in order to achieve a high throughput. In addition, in operation, metrology tool focusing may also suffer from drifts or deviations within the metrology tool, the patterning process, the measurement process itself, or a combinations thereof. Therefore, the data acquired via the metrology tool includes focus variations, for example, focus variations within a set of SEM images.

Out-of-focus images lead to an inaccurate and a non-robust metrology data (CD, EPE, etc.). For example, varying blurriness in the acquired image will lead to variations in estimated positions of feature edges. As such, to distinguish good images from bad images, a quantification of image quality is desired. However, quantification based only on features (or characteristics) of images (e.g., pixel intensity) may not account for variations due to metrology tool itself.

In an embodiment, such quantification not only analyzes the image acquired via the metrology tool itself, but also metrology tool (or associated process) induced variability. In an embodiment, the present disclosure, aims at reducing (in an embodiment, minimizing) such variability in the metrology data (CD, EPE, etc.) being generated from the acquired images.

Figure 8:
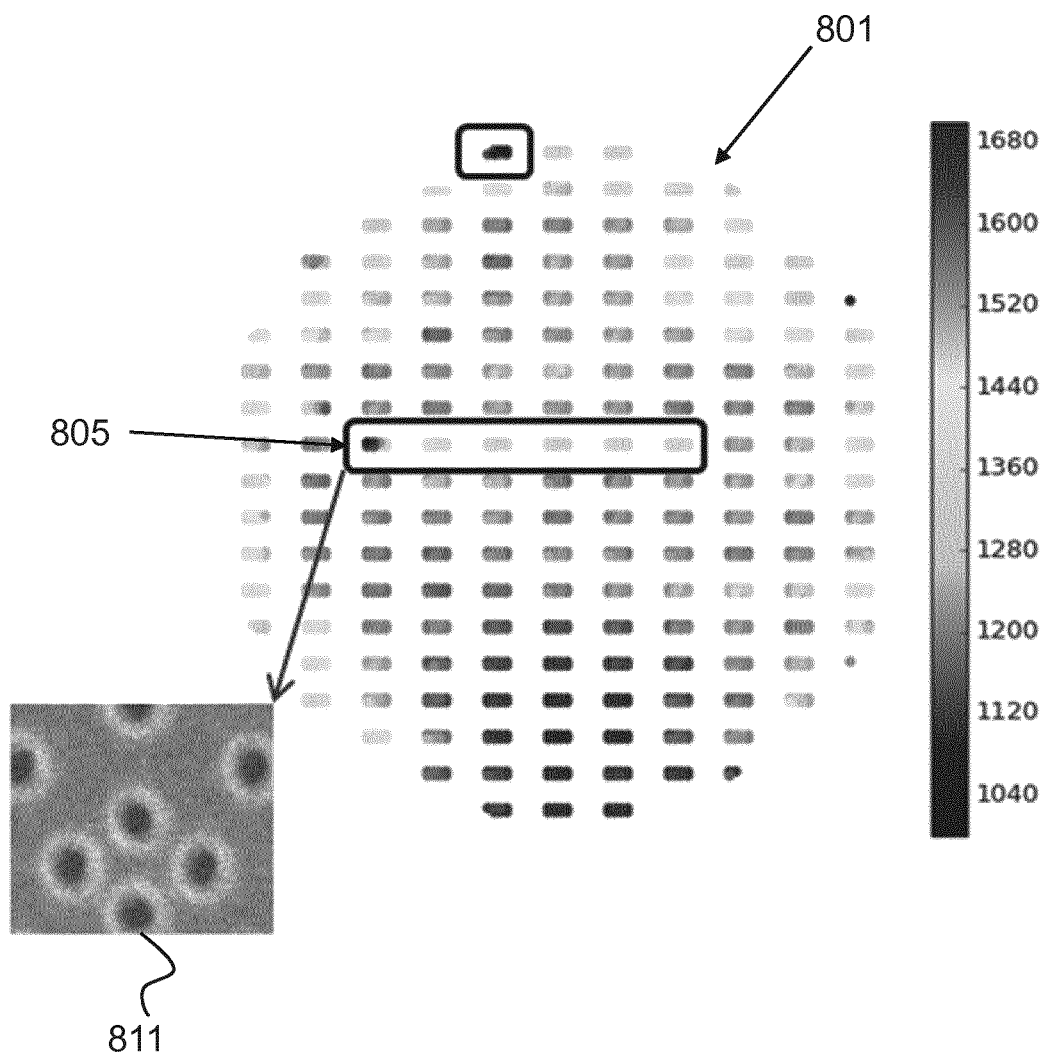
FIG. 8 illustrates an example substrate map of metrology data according to an embodiment.

FIG. 8 illustrates an example substrate map 801 of metrology data according to an embodiment. For example, the metrology data is measurements of pattern sizes on a printed substrate. The metrology data includes across-substrate pattern size variations induced by, for example, an etch process, i.e. a signal to be characterized. In an embodiment, the metrology data, particularly when referring to images, is referred as a signal to be characterized. The substrate map 801 also illustrates multiple locations 805 having relatively low values of pattern size variations. However, the measurements may be affected by focusing issues at those locations (e.g., 805). The focusing issue may be evident from blurred images 811 acquired at the locations 805. Such impacted measurements would affect verification of defects or generation of a substrate map corresponding to a parameter (e.g., CD), overlay) of the patterning process. For illustrations purposes, the example shown in FIG. 8 hints at some temporary tool issue causing a systematic deviation that is relatively easy to identify from the substrate map, however, in more realistic cases such issues would be significantly more difficult to recognize.

Figure 9:
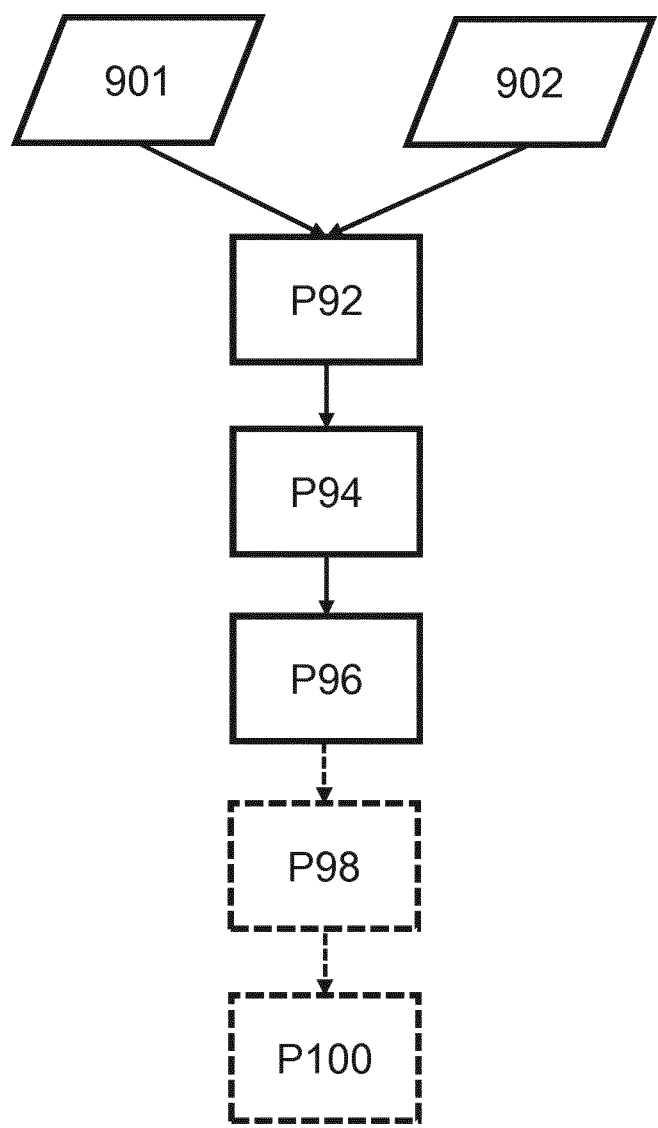
FIG. 9 is a flow chart of a method for determining correction to metrology data according to an embodiment.

FIG. 9 is a flow chart of a method for determining correction to metrology data according to an embodiment. The method for determining, via a computing system (e.g., computing system 100 of FIG. 15), a correction to the metrology data collected via a metrology tool (e.g., a scatterometer, SEM or e-beam) involves use of a quality metric. A quality metric, also referred to herein as an image quality metric, is a metric that quantifies a quality of image obtained from the metrology tool. An example of the quality metric is a focus index (FI) value associated with the metrology tool (e.g., HMI). Further, the quality metric is correlated with the metrology data to account for variations in the metrology tool or related processes. Further, a correction model is defined that uses the correlation between the quality metric and the metrology data to determining a correction to the metrology data. The corrected metrology data can be further used to generate different substrate map corresponding to different parameters of the patterning process or performance of the patterning process. The corrected metrology data can also be used to determine/verify defect locations on a substrate or hot spots on a mask. In an embodiment, based on the identified defect locations the metrology tool may be guided to the defect locations or hot spots to take additional measurements to enable improvements/adjustments to the patterning process such that defects on the substrate are reduced.

Referring to FIG. 9, the method, in process P92, involves obtaining (i) metrology data 901 of a substrate subjected to the patterning process and (ii) a quality metric 902 that quantifies a quality of the metrology data 901 of the substrate. In an embodiment, the metrology data 901 may be measurements from a metrology tool such as a scatterometer or SEM. In an embodiment, the metrology data 901 can be an image of the substrate, for example, an SEM image i.e., an image obtained from a scanning electron microscope (SEM). The image may be a pixelated image, each pixel having a particular intensity. The image may be represented as a vector of intensities of each pixel. Furthermore, a pixel or a group of pixels refer to a particular location of the substrate.

In an embodiment, an image quality may refer to an amount of blurriness or sharpness of one or more features (e.g., bar, via, contact holes, etc.) of the substrate in the image. In an embodiment, the image quality is affected due to variations associated with a characteristic of the metrology tool such as a focus of the metrology tool. In an embodiment, the quality metric (e.g., FI) may be defined based on the characteristic (e.g., focus) of the metrology tool that induces a systematic variations in the image of the substrate. In an embodiment, the quality metric is independent of variations in a dose used in the patterning process, as shown in FIGS. 13A-13B and 14A-14B.

In an embodiment, the quality metric is a focus index of an image of the substrate captured by the metrology tool. The focus index is related to sharpness of an image and may be alternatively referred as sharpness index. The focus index assists in distinguishing good from bad images. In an embodiment, the focus index may be a value between 0 and 1, wherein 0 represents a worst image quality and 1 represents a best image quality. For example, a plot in FIG. 10 illustrates a relationship between the focus index and an image quality according to an embodiment.

Figure 10:
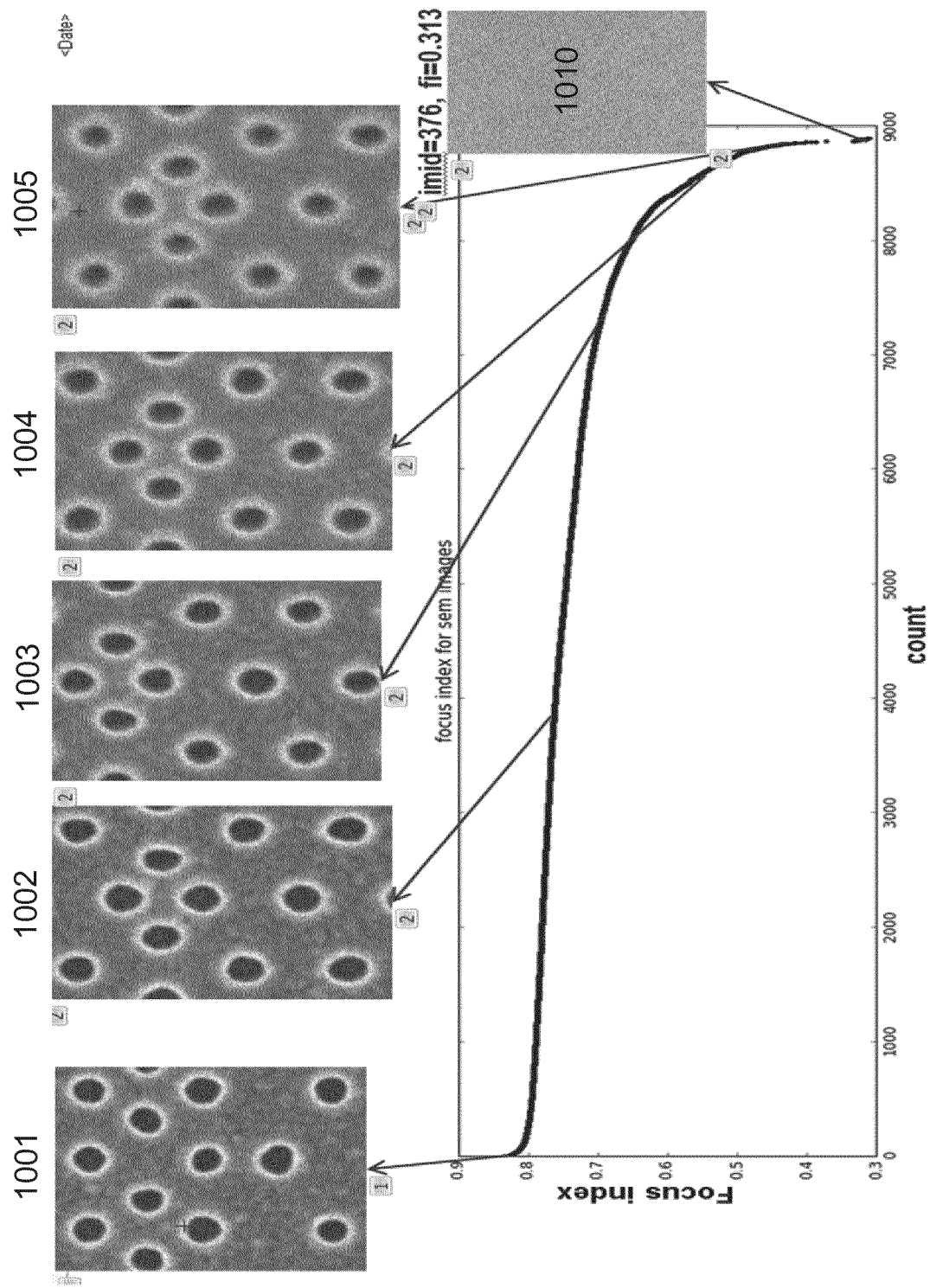
FIG. 10 is graph illustrating relationship between the focus index and an image quality according to an embodiment.

FIG. 10 shows that as the focus index decreases, the image quality decreases. For example, as the focus index decreases from 0.9 to 0.65, the image becomes blurrier, as well as the sharpness and contrast is reduced. For example, see how the images 1001, 1002, 1003, 1004, and 1005 are progressively becoming blurrier and less sharp as the focus index decreases. Beyond the focus index value of 0.65, the image quality decreases exponentially to a point where the image is simply a grey pixelated image 1010 with no features of the substrate.

In an embodiment, the focus index is determined based on a local phase coherence map (LPC) that reveals a phase relationship in a vicinity of a feature location on the substrate between neighboring wavelet coefficients in a scale-space. Phase information preserves important structural features (e.g., features of the substrate) in various types of signals. In an embodiment, LPC map is build based on a complex wavelet analysis tool that provides localized magnitude and phase information in multi-scales. An example LPC computation is discussed in an article *No-reference image sharpness assessment based on local phase coherence measurement*, R. Hassen, Z. Wang and M. Salama, 2010 *IEEE International Conference on Acoustics, Speech and Signal Processing*, Dallas, TX. 2010, pp. 2434-2437, the article is hereby incorporated in its entirety by reference.

In an embodiment, the focus index is determined for a sample selected from the metrology image that has a relatively higher gradient compared to other locations on the image. In an embodiment, the sample is selected from an area of the image that has a maximum gradient. In an embodiment, the focus index may be an average value of a portion of the metrology image. For example, FIG. 11 illustrates an example of computing a focus index according to an embodiment.

Figure 11:
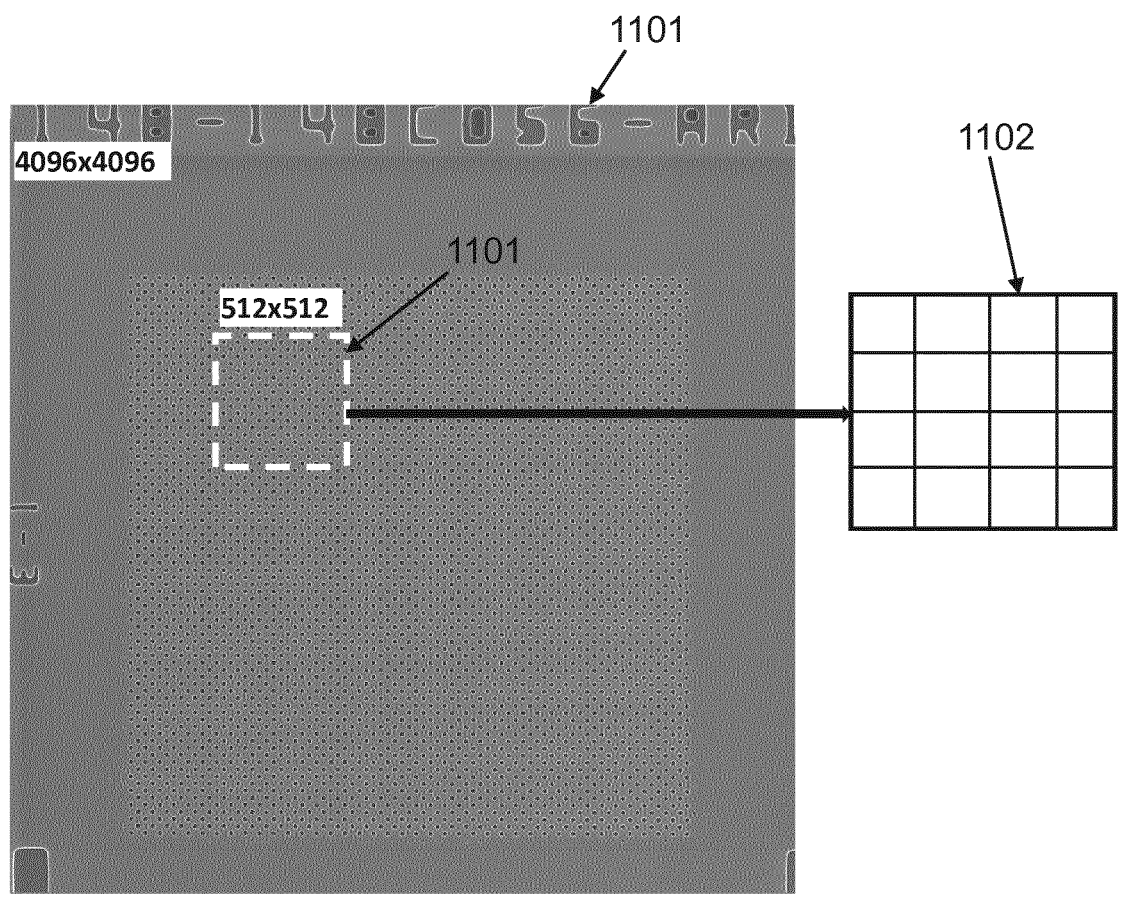
FIG. 11 illustrates an example for computing a focus index according to an embodiment.

In FIG. 11, a full image 1101 of the substrate may be obtained from the metrology tool, e.g., SEM. For example, the image 1101 may be a 4096×4096 pixelated image. Then, a portion 1110 of the full image 1101 may be selected. For example, the portion 1110 may be 512×512 pixel area. The selected portion 1110 may be further divided into a grid 1102 (e.g., a 4×4 grid). A focus index (FI) may be determined for each grid element 1102 and then an average value of the focus index may be computed by summing the individual focus indexes and dividing by a total number of grid elements (e.g., 16 in a 4×4 grid).

It should be understood that the focus index is an example of the quality metric. However, the present method is not limited to the focus index; any other quality metric such as a signal-to-noise ratio may be developed that quantifies an image quality with respect to the metrology tool variations, and used within the scope of the present disclosure.

Figure 12:
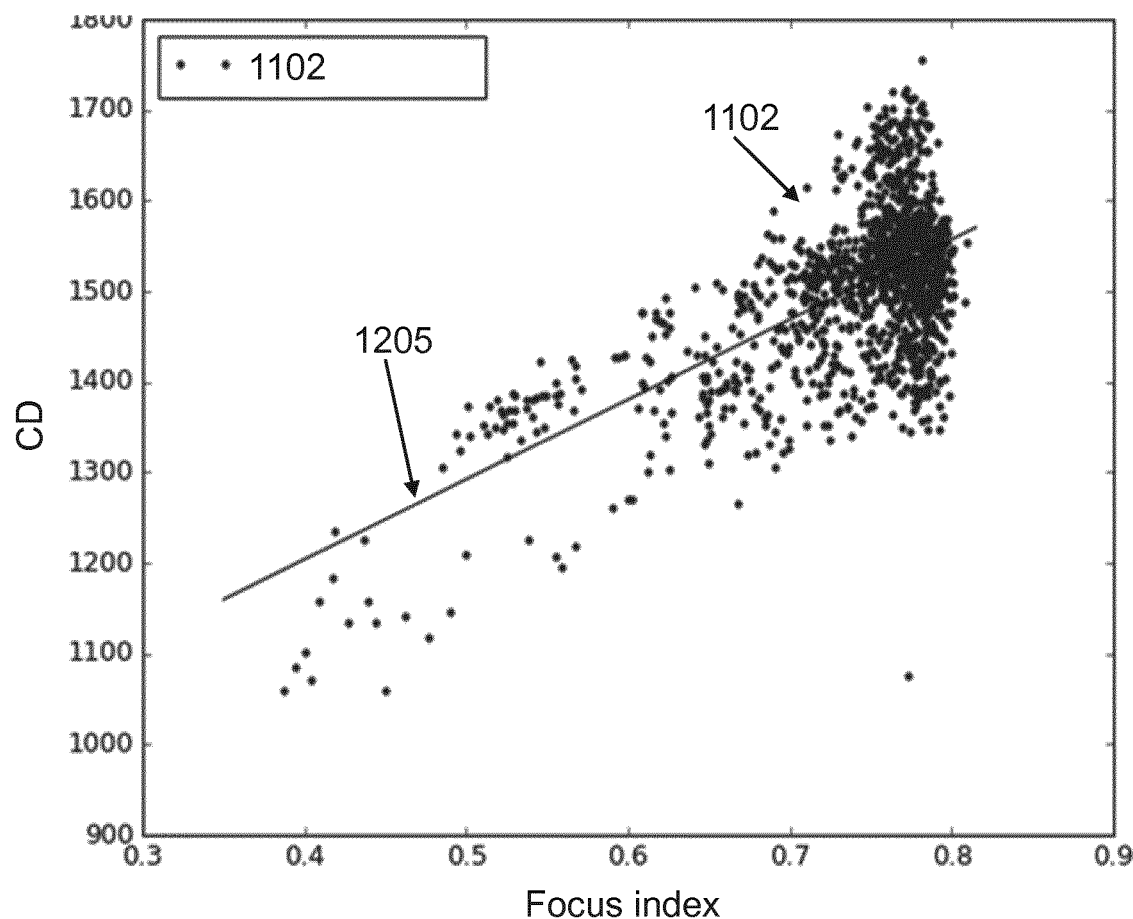
FIG. 12 is an example of a correlation between the focus index and metrology data according to an embodiment.

Further, the method, in process P94, involves establishing, via a computing system (e.g., computing system 100 of FIG. 15), a correlation between the quality metric and the metrology data. In an embodiment, the correlation may a linear relationship established based on statistical analysis or scatter plot of measurements and the quality metric. In an embodiment, the correlation may be in a form of a linear equation, a non-linear equation, or database tables. In an embodiment, one or more correlation may be developed depending on a pattern being measured. For example, a first correlation may be established for measurements related a first pattern (e.g., contact holes). Similarly, a second correlation may be established for measurements related a second pattern (e.g., bars). In an embodiment, the correlation may be based on relative density of features in a particular location with respect to rest of the locations of the substrate. For example, locations (e.g., hot spots) having a higher density of features compared to other locations on the substrate may have a separate correlation specific to the location. FIG. 12 is an example of a correlation 1205 between the focus index and metrology data according to an embodiment.

In FIG. 12, the correlation 1205 is established between CD measurements (CDx) and the focus index for measurements 1201 collected across an entire substrate. As the entire substrate is measured, the CD) measurements may contain all the patterning process variability. Thus, such correlation can be used to correct metrology data having all the patterning process variability. In the example plot of FIG. 12, the correlation 1205 is a linear relationship characterized by a slope of a line (e.g., 1205) representing the correlation 1205. The correlation 1205 can be further used to correct the CD measurements, for example, using a correction model discussed later in the disclosure.

In an embodiment, a more accurate & efficient way to establish the correlation include characterization of a correlation during a metrology recipe setup, for example, by controlled e-beam focus variation with a sampling scheme that minimizes other sources of CD (or feature area, EPE, etc.) variation, or variations in other parameters of the patterning process.

The established correlation may be further used to determine a correction to the metrology data, in process P96. The process P96 involves determining a correction to the metrology data based on the correlation between the quality metric and the metrology data. In an embodiment, the determining of the correction involves determining a corrected value of a parameter measured by a metrology tool based on a correction model. The correction can be applied without setting a FI threshold to distinguish a bad image from a good image, as opposed to other image processing approaches where typically a threshold is defined to identify and discard a blurry image. For example, when the correlation is a linear relationship, the corrected value is determined based on a slope of the correlation between the quality metric and the metrology data, and a difference between a maximum value of the quality metric across the substrate and a value of the quality metric at a point of interest on the substrate. In an embodiment, the measurement is corrected to reduce impact of the blurry images on results of, for example, process simulations (e.g., optics, resist, etch, etc.). An example linear correction model may be defined as:

$$newVal=(max(FI)-FI)*slope+oldVal$$

In the above equation, newVal refers to a corrected value of the metrology data, slope is a slope of the line representing the correlation (e.g., slope of line 1205 in FIG. 12), max(FI) is the maximum value of the FI throughout the substrate, FI is a focus index at a particular location (i.e., a location of interest such as hot spot), and oldVal refers to the metrology data collected via the metrology tool. The operator * is a multiplication operator.

In an embodiment, the method may further include training a correction model such as a machine learning model based on the correlation between the quality metric and the metrology data. In an embodiment, the correction model may be configured to determine real-time corrections to the metrology data collected during the patterning process. In an embodiment, one or more correlations and one or more corresponding correction models developed, for example, for different patterns, as discussed earlier, can be stored in the databases. For example, a correction model corresponding to a particular pattern (e.g., hot spot pattern), and another correction model corresponding to another particular pattern (e.g., a non-hot spot pattern). Thus, in an embodiment, a real-time correction to the metrology data can be performed, for example, an appropriate correlation and the correction model may be chosen depending on the location, pattern, etc. to correct the metrology data as soon as the data is collected by the metrology tool. In an embodiment, such database of correction models may be stored in the metrology tool itself or the metrology tool may be configured to communicate with an external database that stores such correction models and correlations.

In an embodiment, a correlation between image quality metrics and CD measurements may be established by training of a correction model, e.g. during metrology recipe setup and verification, then applying the trained correction model for a subsequent real-time corrections within the respective metrology recipe.

In an embodiment, the above method may be further extended for a die-to-database application. In a die-to-database application, a pattern design information such as a target design may be stored in a database. Such target design information may be extracted from the database to incorporate pattern information such as target feature sizes, pattern density, etc. within the correlation to improve effectiveness of the image quality metrics and correction. For example, the correlation model may include different terms related to different patterns and corresponding coefficients that may be trained based on measurements of a particular die within a printed substrate. For example, a correlation between CD and the focus index may be defined as CD=a1*FI+ a2*FI*pattern1+a3*FI*pattern2. In the equation, a1, a2, and a3 are the coefficients, pattern1 and pattern2 refers category variables corresponding to a first pattern and a second pattern.

In an embodiment, multiple patterns may be grouped based on feature characteristic such as size and type of features (e.g., contact holes) to create a pattern category. The pattern category includes different patterns having similar feature characteristics. Further, a correlation and a corresponding correction model may be developed (in a similar manner as discussed above) for each category of pattern, thus enabling category specific correction to metrology data. Thus, the method may be extended to determining the correction to the metrology data of the pattern belonging to a group of pattern.

In an embodiment, the method may also be effective at mitigating image contrast variations unrelated to focus—e.g. film stack variations. For example, a quality metric based on the film stack variations including thickness, material, etc. may be defined. Such quality metric may be further correlated with the metrology data corresponding to a film stack and the correlation is used to correct the metrology data. In an embodiment, the metrology data comprises an image of a printed substrate, or a parameter of the patterning process. For example, the parameter of the patterning process is a critical dimension, an edge placement error, or an overlay.

In an embodiment, in process P98, the method may further include steps for generating a map of a parameter of the patterning process based on the correction applied to the metrology data. For example, the corrected data may be used to generate a dose map, a focus map, a CD) map, an overlay map, edge placement error map, etc. of the substrate. In an embodiment, a patterned substrate overlay metrology data is obtained for one or more substrates and the corrected according the method in FIG. 9. Then, the contributions of one or more types of lithographic apparatus processing variables for each of at least two pattern transfers are removed from the corrected overlay metrology data. One type of contribution that can be removed is the overlay contribution of a substrate height map obtained, for example, from the levelling sensor of the lithographic apparatus. A difference can be found for the substrate height maps for two pattern transfers and then the difference can be converted to an overlay value and thus the overlay contribution. For example, the Z height difference can be turned into X or Y displacements by considering the height difference as a warpage or bend of the substrate and using first principles to calculate the X or Y displacements (e.g., the displacement can be the variation in Z versus the variation in X or Y times half the thickness of the substrate in, e.g., a clamped region of the substrate or the displacement can be calculated using Kirchhoff-Love plate theory in, e.g., an unclamped region of the substrate). In an embodiment, the translation of the height to the overlay contribution can be determined through simulation, mathematical modelling or experimentation. So, by using such substrate height information per pattern transfer, the overlay impact due to a focus of the metrology tool (e.g., SEM) can be observed and accounted for.

In an embodiment, in process P100, the method may further include steps for guiding a metrology tool to locations of interest determined based on the metrology data, for example, locations having a high focus impact due to focusing issues of the metrology tool. In an embodiment, the locations of interest are hotspots. In an embodiment, the guiding involves generating a signal to move the metrology tool or an inspection apparatus in relation to a substrate (or a patterning device), while the substrate (or a patterning device) remains stationary, to enable measurements at the process window limiting pattern locations (e.g., hotspots) corresponding to the substrate (or a patterning device).

The method of FIG. 9, as discussed above has several advantages. For example, reduced impact of blurred images on simulations that employ the metrology data, for example, to calibrate process models. The correction model makes the measurements more accurate & robust (e.g., independent of the process variations). As the measurements are corrected based on a quality metric, it reduces or saves time of re-inspection, where re-inspection is typically performed to mitigate focus errors by actually re-measuring the substrate. The method is a non-destructive approach, i.e., it avoids multiple exposure of the substrate to electron beams.

Another advantage, as mentioned earlier, can be the quality metric used in the correlation, which is further employed in a correction model, is independent of a parameter (e.g., dose and focus) of the patterning process, as illustrated in FIGS. 13A-13B and 14A-14B. In other words, variations in, for example, dose/focus may not affect the correction model.

Figure 13A:
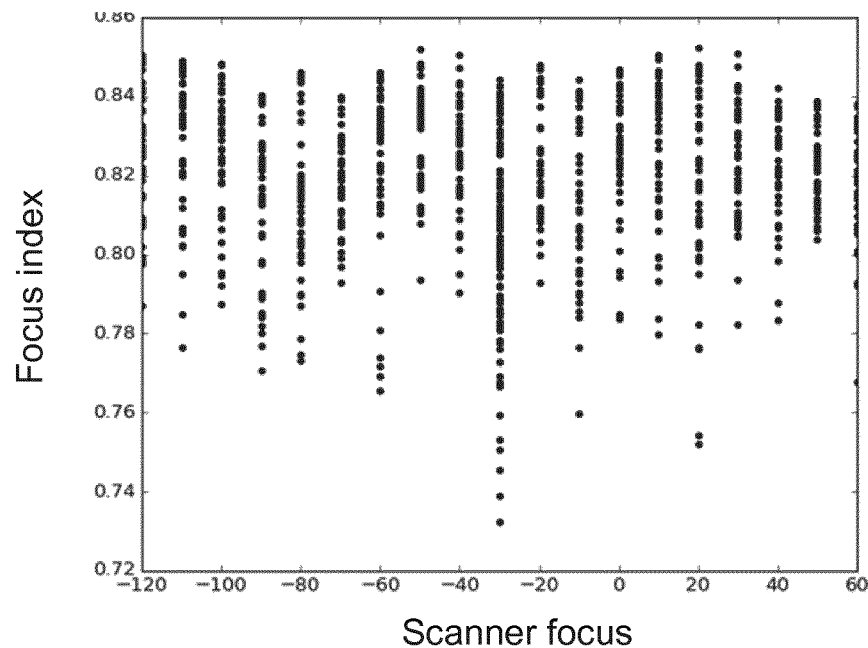
FIG. 13A illustrates relation between a focus of a patterning apparatus and the focus index for a first pattern according to an embodiment.
Figure 13B:
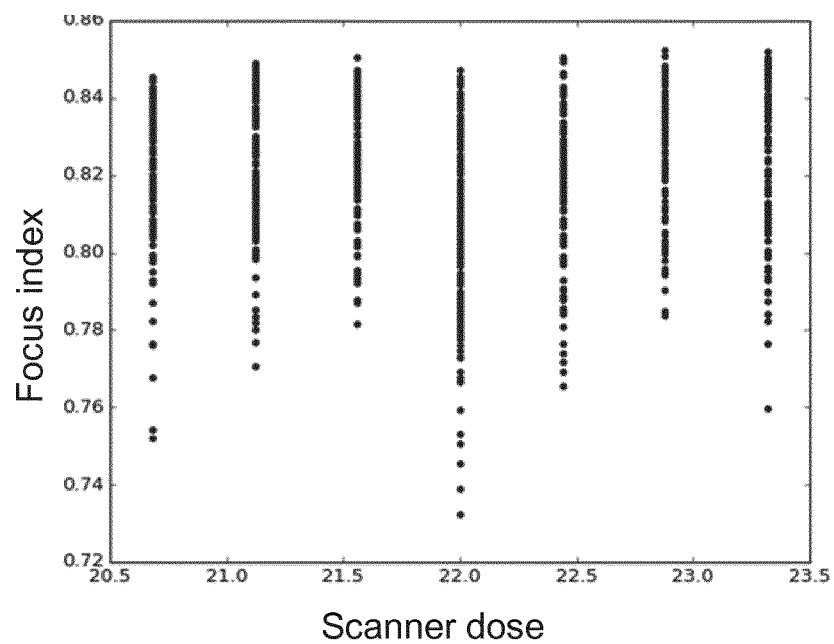
FIG. 13B illustrates relation between a dose of a patterning apparatus and the focus index for the first pattern according to an embodiment.

FIG. 13A illustrates relation between a focus of a patterning apparatus and the focus index for a first pattern (e.g., SRAM patterns). As shown by the scatter plot, the focus index remains approximately between 0.86 and 0.74 for different focus values of the patterning apparatus and no particular trend is observed. Similarly, FIG. 13B illustrates that the focus index for the first pattern is independent of a dose of the patterning apparatus.

Figure 14A:
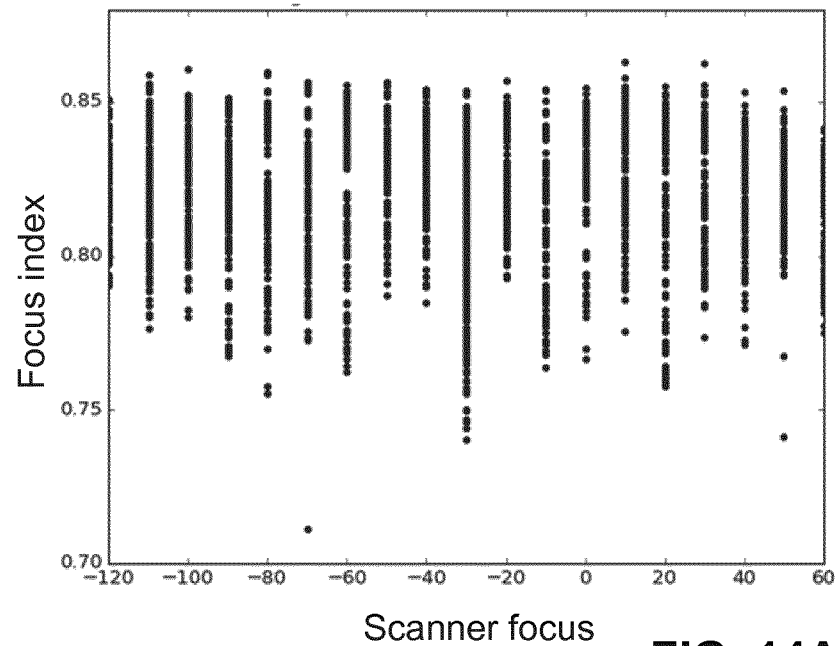
FIG. 14A illustrates relation between a focus of a patterning apparatus and the focus index for a second pattern according to an embodiment.
Figure 14B:
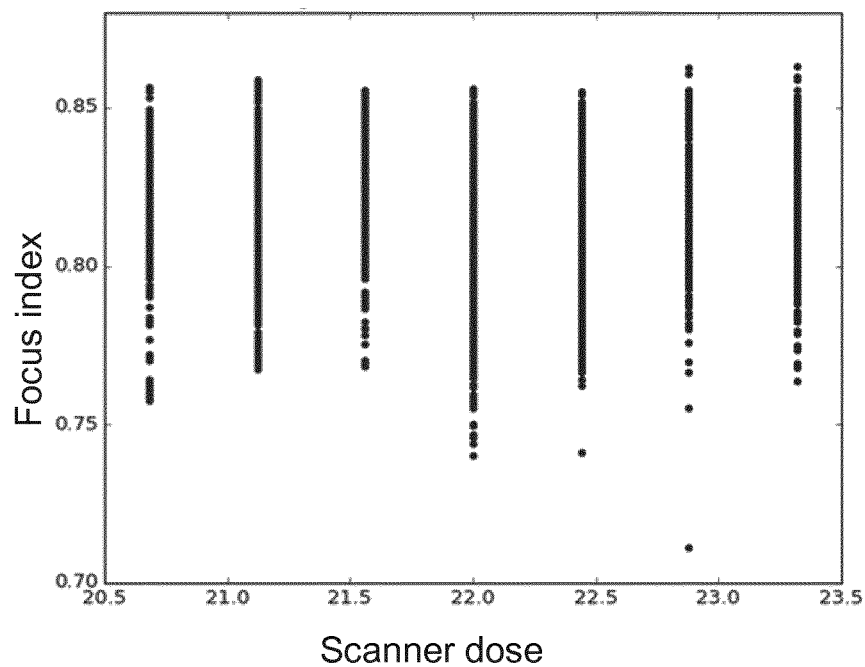
FIG. 14B illustrates relation between a dose of a patterning apparatus and the focus index for the second pattern according to an embodiment.

The independence of the quality metric (e.g., focus index) with respect to the focus and dose of the patterning apparatus is further confirmed for different pattern (e.g., logic vias) in FIGS. 14A and 14B. As shown by the scatter plots, the focus index remains approximately between 0.86 and 0.74 for different focus and dose values of the patterning apparatus and no particular trend is observed.

Figure 15:
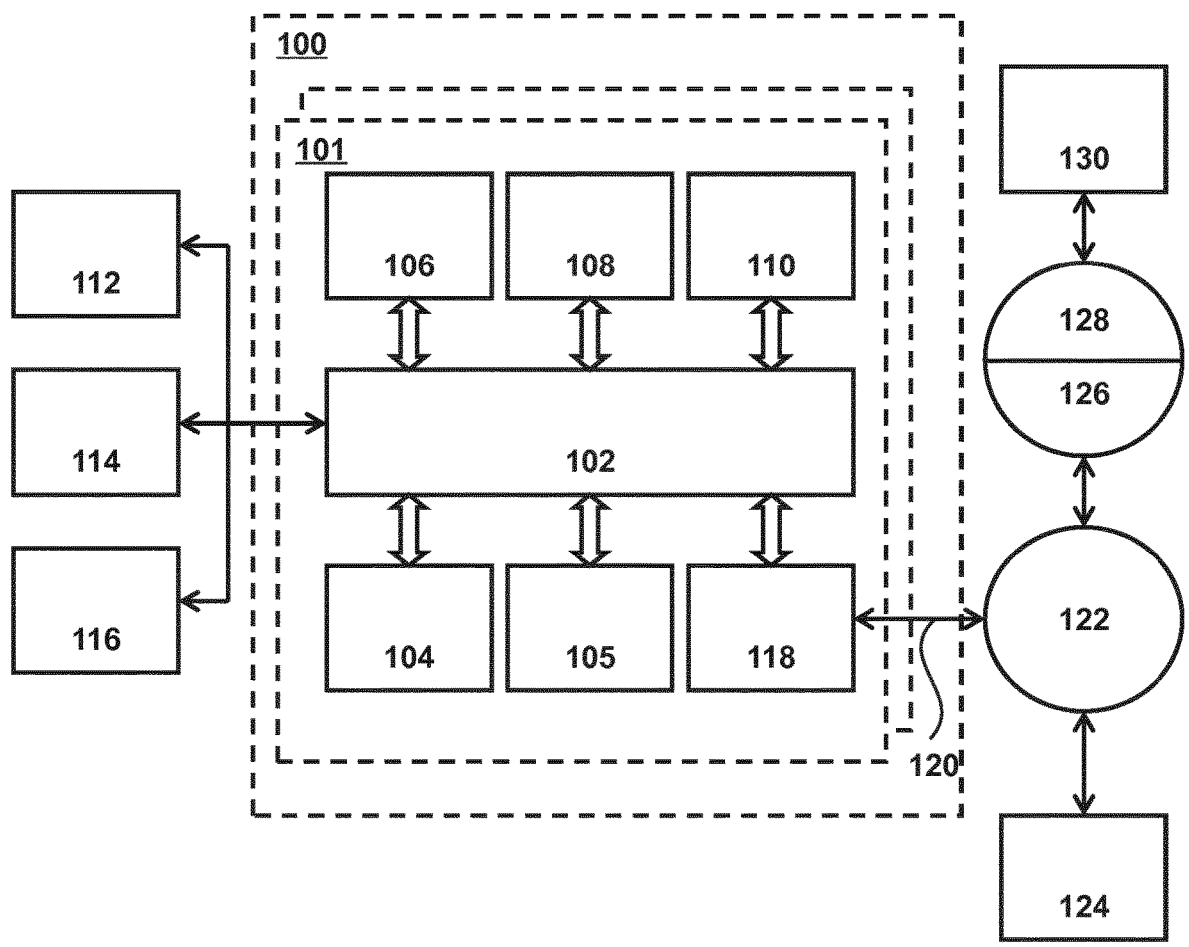
FIG. 15 is a block diagram of an example computer system according to an embodiment.

FIG. 15 is a block diagram that illustrates a computing system 100 which can assist in implementing the optimization methods and flows disclosed herein. Computing system 100 may comprise one or more individual computer systems, such as computer system 101. Further, computing system 100 may comprise, for example, a metrology tool or a portion of a metrology tool. Computer system 101 includes a bus 102 or other communication mechanism for communicating information, and a processor 104 (or multiple processors 104 and 105) coupled with bus 102 for processing information. Computer system 101 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 101 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 101 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 101 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD), any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 101 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 101 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126.

ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 101, are exemplary forms of carrier waves transporting the information. Communication between the one or more computer system 101s that comprise computing system 100 may occur via any of various mediums. For example, communication between the one or more computer system 101s can occur via local network 122, internet 128, a wi-fi network, a cellular network, or any other usable communications medium.

Computer system 101 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, or stored in storage device 110, or other non-volatile storage for later execution. In this manner, computer system 101 may obtain application code in the form of a carrier wave.

Figure 16:
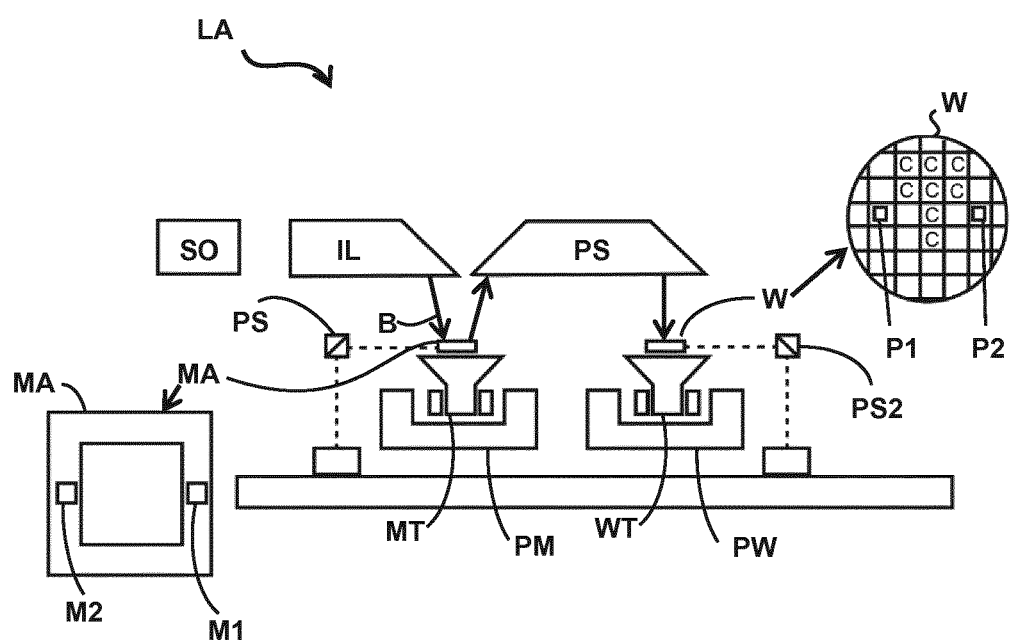
FIG. 16 is a schematic diagram of another lithographic projection apparatus according to an embodiment.

FIG. 16 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL, receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.
2. In scan mode, the support structure (e.g. mask table) MT and the substrate table WT are scanned synchronously while a pattern imparted to the radiation beam is projected onto a target portion ((i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
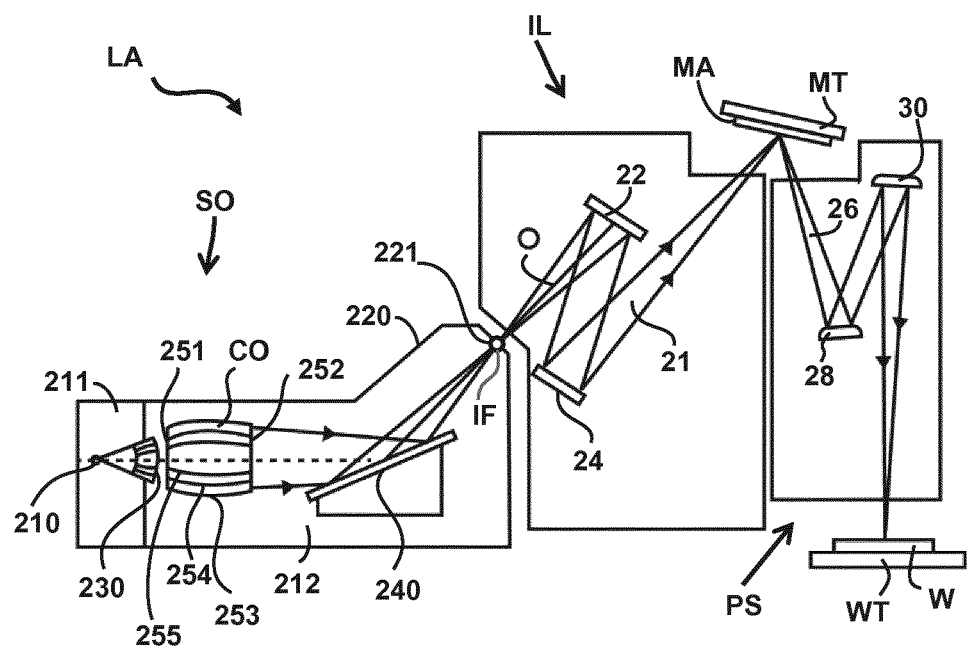
FIG. 17 is a more detailed view of the apparatus in FIG. 16 according to an embodiment.

FIG. 17 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li. Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 18:
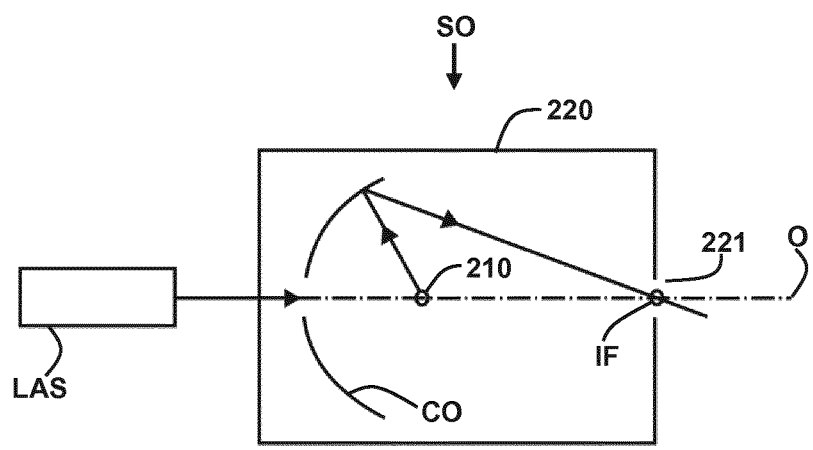
FIG. 18 is a more detailed view of the source collector module of the apparatus of FIG. 16 and FIG. 17 according to an embodiment.

Alternatively, the source collector module SO may be part of an LPP radiation system as shown in FIG. 18. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for correcting metrology data of a patterning process, the method comprising:
   obtaining (i) metrology data of a substrate subjected to the patterning process and (ii) a quality metric that quantifies a quality of the metrology data of the substrate;
   establishing, via a computing system, a correlation between the quality metric and the metrology data; and
   determining, via the computing system, a correction to the metrology data based on the correlation between the quality metric and the metrology data.

2. The method of clause 1, wherein determining the correction comprises determining a corrected value of the metrology data based on a correction model, wherein the metrology data is obtained via a metrology tool.

3. The method of clause 2, wherein the corrected value is determined based on a slope of the correlation between the quality metric and the metrology data, and a difference between a maximum value of the quality metric across the substrate and a value of the quality metric at a point of interest on the substrate.

4. The method of any of clauses 1 to 3, wherein the quality metric is a focus index of an image of the substrate captured via the metrology tool.

5. The method of clause 4, wherein the focus index is determined based on a local phase coherence map that reveals a phase relationship, in a vicinity of a feature location on the substrate, between neighbouring wavelet coefficients in a scale-space.

6. The method of any of clauses 4 to 5, wherein the focus index is determined based on a sample selected from the image that has a relatively higher gradient compared to other locations on the image.

7. The method of clause 6, wherein the sample is an area of the image that has a relatively high gradient compared to remaining areas of the image.

8. The method of any of clauses 1 to 7, wherein the quality metric is independent of variations in a dose used in the patterning process.

9 The method of any of clauses 1 to 8, wherein the metrology data comprises an image of a printed substrate, or a parameter of the patterning process.

10. The method of any of clauses 1 to 9, wherein the parameter of the patterning process is a critical dimension, an edge placement error, or an overlay.

11. The method of any of clauses 1 to 10, further comprising generating a map of a parameter of the patterning process based on the correction applied to the metrology data.

12. The method of clause 11, wherein the map is a dose map, a focus map, a critical dimension (CD) map, an overlay map, or an edge placement error map.

13. The method of any of clauses 1 to 12, wherein the metrology data is a scanning electron microscope image, or an e-beam image.

14. The method of any of clauses 1 to 13, further comprising training a correction model based on the correlation between the quality metric and the metrology data, wherein the correction model is configured to determine real-time corrections to metrology data collected during the patterning process.

15. The method of any of clauses 1 to 14, wherein the correction model is included in a metrology tool.

16. A method for performing a real-time correction of metrology data of a patterning process, the method comprising:
   obtaining (i) metrology data of a substrate subjected to the patterning process and (ii) a correction model implementing a correlation between a quality metric and the metrology data for a particular pattern; and
   determining, via a computing system, a correction to the metrology data of the particular pattern based on the correction model.

17. The method of clause 16, wherein the determining the correction comprises determining a corrected value of the metrology data based on the correction model, wherein the metrology data is obtained via a metrology tool.

18. The method of clause 17, wherein the corrected value is determined based on a slope of the correlation between the quality metric and the metrology data, and a difference between a maximum value of the quality metric across the substrate and the quality metric.

19. The method of any of clauses 16 to 18, wherein the quality metric is a focus index of an image of the substrate captured via the metrology tool.

20. The method of any of clauses 16 to 19, wherein the metrology data comprises an image of a printed substrate or a parameter of the patterning process.

21. The method of clause 20, wherein the metrology data comprising the image of the printed substrate or the parameter of the patterning process includes the metrology data comprising the image of the printed substrate and the parameter of the patterning process.

22. The method of any of clauses 16 to 21, further comprising grouping one or more of the particular patterns based on feature characteristics of the particular pattern into a pattern category; and determining the correction to the metrology data of the pattern belonging to the pattern category.

23. A computer program product comprising a non-transitory computer readable medium having instructions recorded thereon, the instructions when executed by a computer implementing the method of any of clauses 1 to 22.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing." "calculating." "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a." "an." and "the" include plural referents unless the content explicitly indicates otherwise. Thus, for example, reference to "an" element or "a" element includes a combination of two or more elements, notwithstanding use of other terms and phrases for one or more elements, such as "one or more." As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C. Terms describing conditional relationships, e.g., "in response to X. Y." "upon X. Y.", "if X. Y." "when X. Y." and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D)) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step (and step D)), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method for correcting metrology data of a patterning process, the method comprising:
   obtaining (i) metrology data of a substrate subjected to the patterning process and (ii) an image quality metric that quantifies how well a metrology tool has been able to produce an image from which the metrology data is measured or otherwise obtained;
   establishing, via a hardware computing system, a correlation between the image quality metric and the metrology data; and
   determining, via the computing system, a correction to the metrology data based on the correlation between the image quality metric and the metrology data.

2. The method of claim 1, wherein determining the correction comprises determining a corrected value of the metrology data based on a correction model.

3. The method of claim 2, wherein the corrected value is determined based on a slope of the correlation between the image quality metric and the metrology data, and a difference between a maximum value of the image quality metric across the substrate and a value of the image quality metric at a point of interest on the substrate.

4. The method of claim 1, wherein the image quality metric is a focus index of an image of the substrate captured via the metrology tool.

5. The method of claim 4, wherein the focus index is determined based on a local phase coherence map that reveals a phase relationship, in a vicinity of a feature location on the substrate, between neighbouring wavelet coefficients in a scale-space.

6. The method of claim 4, wherein the focus index is determined based on a sample selected from the image that has a relatively higher gradient compared to other locations on the image.

7. The method of claim 6, wherein the sample is an area of the image that has a relatively high gradient compared to remaining areas of the image.

8. The method of claim 1, wherein the image quality metric is independent of variations in a dose used in the patterning process.

9. The method of claim 1, wherein the metrology data comprises an image of a printed substrate, or a parameter of the patterning process.

10. The method of claim 1, wherein the metrology data comprises a parameter of the patterning process and the parameter of the patterning process is a critical dimension, an edge placement error, or an overlay.

11. The method of claim 1, further comprising generating a map of a parameter of the patterning process based on the correction applied to the metrology data.

12. The method of claim 11, wherein the map is a dose map, a focus map, a critical dimension (CD) map, an overlay map, or an edge placement error map.

13. The method of claim 1, wherein the metrology data is a scanning electron microscope image, or an e-beam image.

14. The method of claim 1, further comprising training a correction model based on the correlation between the image quality metric and the metrology data, wherein the correction model is configured to determine real-time corrections to metrology data collected during the patterning process.

15. A computer program product comprising a non-transitory computer readable medium having instructions therein, the instructions, when executed by a computer system, configured to cause the computer system to at least:
   obtain (i) metrology data of a substrate subjected to a patterning process and (ii) an image quality metric that quantifies how well a metrology tool has been able to produce an image from which the metrology data is measured or otherwise obtained;
   establish a correlation between the image quality metric and the metrology data; and
   determine a correction to the metrology data based on the correlation between the image quality metric and the metrology data.

16. The computer program product of claim 15, wherein the instructions configured to cause the computer system to determine the correction are further configured to cause the computer system to determine the correction based on a slope of the correlation between the image quality metric and the metrology data, and a difference between a maximum value of the image quality metric across the substrate and a value of the image quality metric at a point of interest on the substrate.

17. The computer program product of claim 15, wherein the image quality metric is a focus index of an image of the substrate captured via the metrology tool.

18. The computer program product of claim 15, wherein the image quality metric is independent of variations in a dose used in the patterning process.

19. The computer program product of claim 15, wherein the instructions are further configured to cause the computer system to generate a map of a parameter of the patterning process based on the correction applied to the metrology data.

20. The computer program product of claim 15, wherein the instructions are further configured to cause the computer system to train a correction model based on the correlation between the image quality metric and the metrology data, wherein the correction model is configured to determine real-time corrections to metrology data collected during the patterning process.

* * * * *